US011164837B1

(12) United States Patent
Arifeen

(10) Patent No.: US 11,164,837 B1
(45) Date of Patent: Nov. 2, 2021

(54) SEMICONDUCTOR DEVICE PACKAGES WITH ANGLED PILLARS FOR DECREASING STRESS

(71) Applicant: Micron Technology, Inc., Boise, ID (US)

(72) Inventor: Shams U. Arifeen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/879,637

(22) Filed: May 20, 2020

(51) Int. Cl.
  *H01L 23/00* (2006.01)
(52) U.S. Cl.
  CPC .............. *H01L 24/14* (2013.01); *H01L 24/16* (2013.01); *H01L 24/81* (2013.01); *H01L 2224/14517* (2013.01); *H01L 2224/16227* (2013.01); *H01L 2224/81203* (2013.01); *H01L 2224/81815* (2013.01); *H01L 2924/3511* (2013.01); *H01L 2924/3512* (2013.01)
(58) Field of Classification Search
  CPC .......... H01L 24/14; H01L 24/16; H01L 24/81
  See application file for complete search history.

(56) References Cited

U.S. PATENT DOCUMENTS

| | | | | |
|---|---|---|---|---|
| 8,288,871 | B1* | 10/2012 | Shieh | H01L 23/49838 257/773 |
| 10,784,223 | B2* | 9/2020 | Chuang | H01L 24/81 |
| 2012/0098120 | A1* | 4/2012 | Yu | H01L 24/16 257/737 |
| 2013/0062755 | A1* | 3/2013 | Kuo | H01L 24/13 257/737 |
| 2013/0335939 | A1* | 12/2013 | Aleksov | H01L 24/14 361/773 |
| 2020/0328139 | A1* | 10/2020 | Chiu | H01L 25/0652 |

* cited by examiner

*Primary Examiner* — Errol V Fernandes
(74) *Attorney, Agent, or Firm* — Perkins Coie LLP

(57) ABSTRACT

Semiconductor devices having mechanical pillar structures, such as angled pillars, that are rectangular and orientated with respect to a semiconductor die to reduce bending stress and in-plane shear stress at a semiconductor die to which the angled pillars are attached, and associated systems and methods, are disclosed herein. The semiconductor device can include angled pillars connected to the semiconductor die and to a package substrate. The angled pillars can be configured such that they are orientated relative to a direction of local stress to increase section modulus.

20 Claims, 8 Drawing Sheets

SEMICONDUCTOR DEVICE PACKAGES WITH ANGLED PILLARS FOR DECREASING STRESS

TECHNICAL FIELD

The present technology generally relates to semiconductor devices having pillars, and in some embodiments more particularly to angled pillar orientations for die-to-die, die-to-substrate, and/or package-to-package interconnects.

BACKGROUND

Microelectronic devices, such as memory devices, microprocessors, and light emitting diodes, typically include one or more semiconductor die mounted to a substrate. Semiconductor die can include functional features, such as memory cells, processor circuits, and interconnecting circuitry. Semiconductor die also typically include bond pads electrically coupled to functional features, active pillars electrically coupled to active bond pads, and dummy pillars for structural support. The active pillars can be pins or other types of structures for connecting the semiconductor die to busses, circuits, or other assemblies.

The semiconductor die can be electrically coupled to another substrate via flip-chip die attach processes (e.g., a thermo-compression bonding (TCB) or mass reflow operation) in which conductive pillars formed on the bond pads or other areas of the die are coupled to the substrate via a bond material disposed between the conductive pillars and the substrate. For example, active pillars are attached to electrically conductive terminals on the substrate. To attach the bond material to the substrate, the semiconductor package is heated to reflow the bond material and form a robust connection. However, heating the semiconductor package and/or subsequently cooling the semiconductor package, along with thermal cycling during product reliability tests and power cycling during end-customer usage, can induce significant thermo-mechanical stress between the semiconductor die and the substrate due to a mismatch in the coefficients of thermal expansion (CTE) of these components. Often, the stress can induce interfacial delamination and crack growth in the passivation material of the semiconductor die near one or more of the bond pads, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
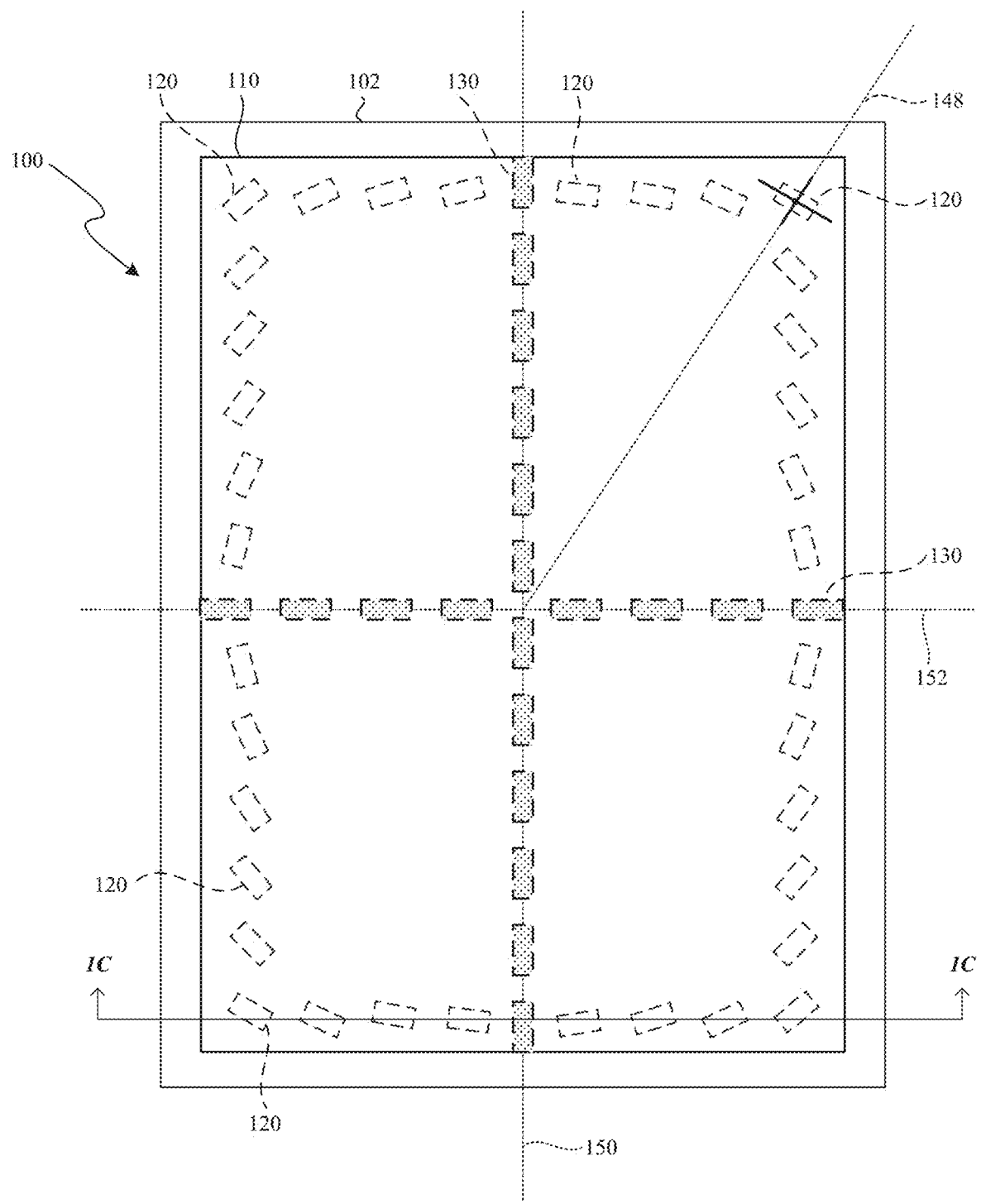
FIG. 1A is a plan view of a semiconductor package having angled pillars configured in accordance with embodiments of the present technology.

Specific details of several embodiments of semiconductor devices having mechanical rectangular pillars that are angled based on the local directionality of stresses to increase a section modulus and thereby reduce bending stress and in-plane shear stress at the interface between the angled pillars and the semiconductor die are disclosed. The term "semiconductor device" generally refers to a solid-state device that includes one or more semiconductor materials. Examples of semiconductor devices include logic devices, memory devices; microprocessors, and diodes among others. Furthermore, the term "semiconductor device" can refer to a finished device or to an assembly, or other structure at various stages of processing before becoming a finished device. Depending upon the context in which it is used, the term "substrate" can refer to a wafer-level substrate or to a singulated, die-level substrate. A person having ordinary skill in the relevant art will recognize that the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-3A and 4-6.

In several of the embodiments described below, a semiconductor device can include a semiconductor substrate including circuit elements, active bond pads and/or inactive bond areas, and angled pillars that are oriented at an Oblique angle with respect to orthogonal reference axes. The semiconductor device can also include aligned pillars that are parallel or perpendicular to the orthogonal reference axes. The pillars of the semiconductor device can be attached to terminals of a package substrate by a bond material. Some of the angled pillars can be connected to electrically, inactive bond areas, such as areas on a passivation material on the semiconductor substrate. Such pillars are known as dummy pillars. Other pillars can be electrically connected to electrically active bond pads that are electrically coupled to power, ground and/or other circuit elements of the semiconductor substrate. Such pillars are active pillars, and they can be angled pillars and/or aligned pillars. The angled pillars can have rectangular cross-sections and be orientated at an oblique angle relative to the orthogonal reference axes (e.g., an angle other than being parallel to or perpendicular to orthogonal axes aligned with the edges of the semiconductor substrate). In some embodiments, some or all of the angled pillars can be orientated at different oblique angles, or some or all of the angled pillars can be orientated at the same oblique angle. The angled pillars can be orientated at an angle based on the local direction of chip-package interface (CPI) stresses caused by, for example, mismatches between a coefficient of thermal expansion (CTE) of the semiconductor die and a CTE of the package substrate. Accordingly, the angled pillars can reduce the likelihood of mechanical failure around the bond pads and/or bond areas after, for example, flip-chip die attach processing (e.g., thermo-compression bonding (TCB) or mass reflowing) has been performed and/or during operation (e.g., power cycling or extreme temperature environments).

At the beginning of a TCB operation, heating causes a bond material in interconnects to reflow and electrically connect conductive pillars to a package substrate. Semiconductor packages are often heated to 200° C. or greater (e.g., greater than about 217° C.) to reflow the bond material. During the TCB operation, a compressive force is also applied to attach the interconnects to the package substrate. One drawback of TCB operations is that cooling of the semiconductor package can cause the semiconductor die and the package substrate to warp or bend relative to one another, which can exert stresses on the pillars. For example, the semiconductor die can have a CTE that is different than a CTE of the package substrate, and the CTE differential can cause them to warp relative to one another during cooling and/or heating of the semiconductor package. Accordingly, the package substrate 102 can have a warped, non-planar shape after cooling. In other embodiments, the semiconductor die or both the semiconductor die and the package substrate can have a non-planar, warped shape after cooling. The CTE differential between the semiconductor die and the package substrate can laterally stress and bend the interconnects. This can cause cracks to form and propagate within the semiconductor substrate, which can cause mechanical and/or electrical failures.

Many embodiments of the present technology are described below in the context of mechanical pillar structures that have a rectangular cross-section and are angled relative to the direction of stress to provide an adequate section modulus that can withstand the CPI stresses. A person having ordinary skill in the relevant art will also understand that the present technology may have embodiments for forming mechanical pillar structures with rectangular cross-sections on either the first side or the second side of a substrate assembly, and the mechanical pillar structures may be used in the context of other electrical connectors associated with a semiconductor assembly. The present technology may accordingly be practiced without several of the details of the embodiments described herein with reference to FIGS. 1A-3A and 4-6. For example, some details of semiconductor devices and/or packages well known in the art have been omitted so as not to obscure the present technology. In general, it should be understood that various other devices and systems in addition to those specific embodiments disclosed herein may be within the scope of the present technology.

For ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a plan view of a semiconductor package 100 ("package 100") having angled pillars 120 configured in accordance with embodiments of the present technology. The package 100 can include a package substrate 102, a semiconductor die 110, and the angled pillars 120 extending between the package substrate 102 and the semiconductor die 110. The angled pillars 120 can be orientated at an oblique angle relative to reference axes, such as non-perpendicular and non-parallel angles with respect to orthogonal references axes defined by the edges of the semiconductor die 110. In some embodiments, the angled pillars 120 can be referred to as outriggers. The package 100 can further include aligned pillars 130 that are at least substantially perpendicular to or parallel to the reference axes. Depending on the application, the angled pillars 120 and/or the aligned pillars 130 can be "active pillars" that are electrically coupled to electrical circuitry in the package substrate 102 and/or the semiconductor die 110, or the angled pillars 120 and/or the aligned pillars 130 can be "dummy pillars" that are not electrically coupled to either one or both of the package substrate 102 and/or the semiconductor die 110.

Figure 1B:
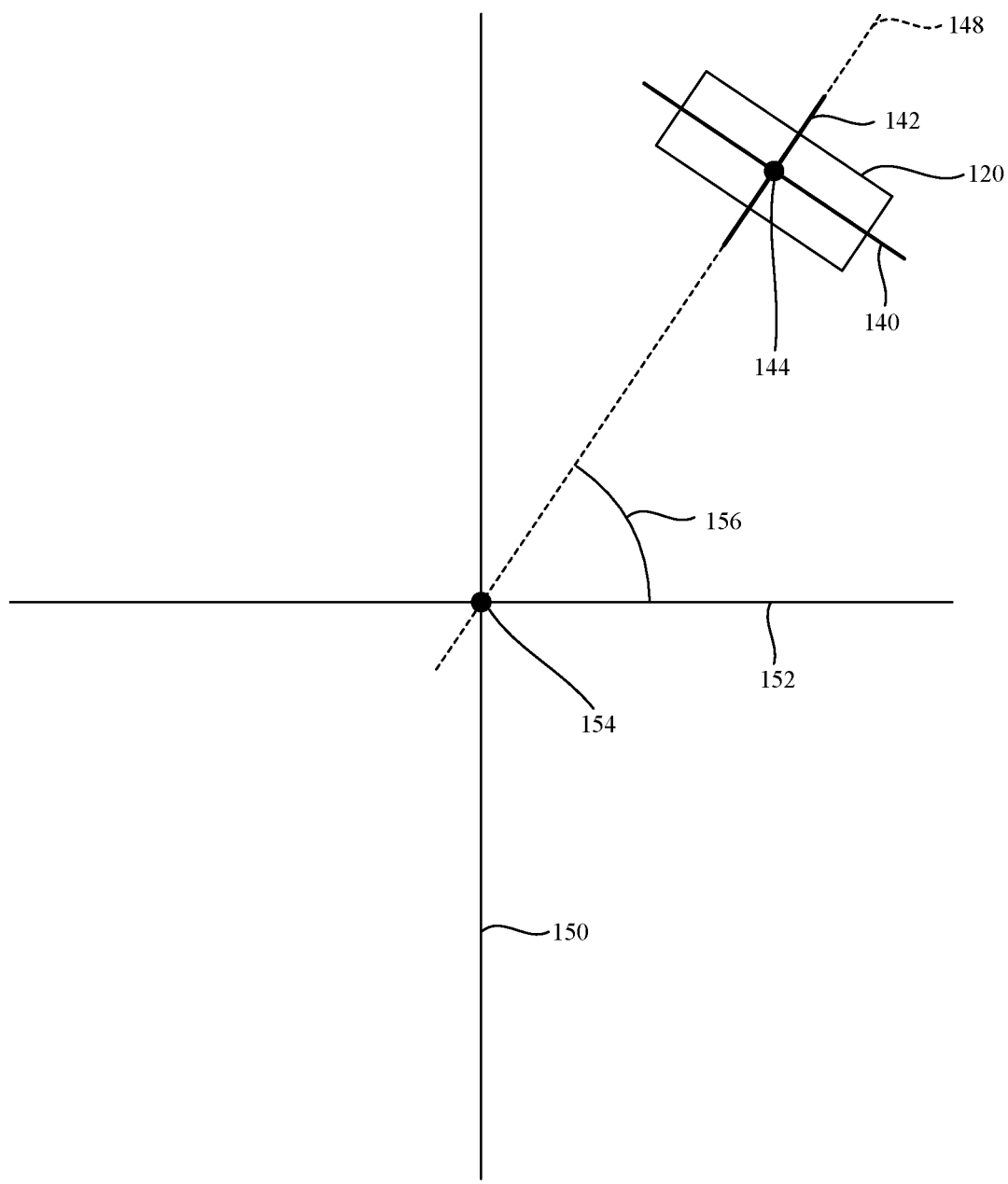
FIG. 1B is a diagram of a coordinate system with reference axes and an example of the orientation of an angled pillar of the semiconductor die of FIG. 1A.

FIG. 1B is a diagram of a coordinate system with reference axes and an example of the orientation of an angled pillar 120 of the semiconductor die 110 of FIG. 1A in accordance with embodiments of the present technology. As shown in FIGS. 1A and 1B, the angled pillars 120 can have a non-circular cross-sectional shape (e.g., rectangular, oval, elliptical, square, rectilinear, or irregular) with a major axis 140, a minor axis 142, and a center coordinate 144. The edges of the angled pillar 120 can define a plane figure of the angled pillar 120. The center coordinate 144 can be defined by a centroid of the plane figure of the angled pillar 120. In the illustrated embodiment, the major axis 140 and minor axis 142 define a plane of the angled pillar 120 that is parallel to an active surface of the semiconductor die 110. In some other embodiments, the major axis 140 and minor axis 142 can define a plane of the angled pillar 120 that is orthogonal to the active surface of the semiconductor die 110. The active surface of the semiconductor die 110 can have a major reference axis 150, a minor reference axis 152, and a center coordinate 154 at the center of the active surface. The major reference axis 150 and the minor reference axis 152 can define orthogonal reference axes. When the semiconductor die 110 has a rectilinear footprint, the major reference axis 150 can be at least substantially parallel to one edge of the semiconductor die 110 and the minor reference axis 152 can be at least substantially parallel to an orthogonal edge of the semiconductor die 110. The edges of the semiconductor die 110 can define a plane figure of the semiconductor die 110. The center coordinate 154 can be defined by a centroid of the plane figure of the semiconductor die 110. The angled pillar 120 is orientated such that a line 148 passing through the center coordinate 144 and the center coordinate 154 is (a) at least approximately normal to the major axis 140 of the angled pillar 120 and (b) at an oblique angle with respect to the major axis 150 and the minor axis 152. In some embodiments, approximately normal includes 90 degrees plus or minus 2 to 8 degrees, 3 to 7 degrees, 4 to 6 degrees, and 5 degrees. In some embodiments, the angled pillar 120 can be configured on the semiconductor die 110 with an angle of rotation 156 denoted as $\theta_i$. The angle of rotation 156 can be defined as $\theta_i = \tan^{-1}(h_i/w_i)$, where $(h_i, w_i)$ is the coordinate location of the angled pillar 120 with respect to the center coordinate 154 of the active surface of the semiconductor die 110.

In the embodiment shown in FIG. 1A, there are 36 angled pillars 120 and 20 active pillars 130, but the package 100 can include fewer or more angled pillars 120 and active pillars 130. For example, the package 100 can include tens, hundreds, thousands, or more angled pillars 120 and tens, hundreds, thousands, or more active pillars 130 arrayed between the semiconductor die 100 and the package substrate 102. In some embodiments, the angled pillars 120 on the semiconductor die 110 can have the same dimensions (e.g., length, width, and height). In other embodiments, some of the angled pillars 120 on the semiconductor die 110 can have the same dimensions while other of the angled pillars 120 can have different dimensions. In other embodiments, each angled pillar 120 on the semiconductor die 110 can have different dimensions.

Figure 1C:
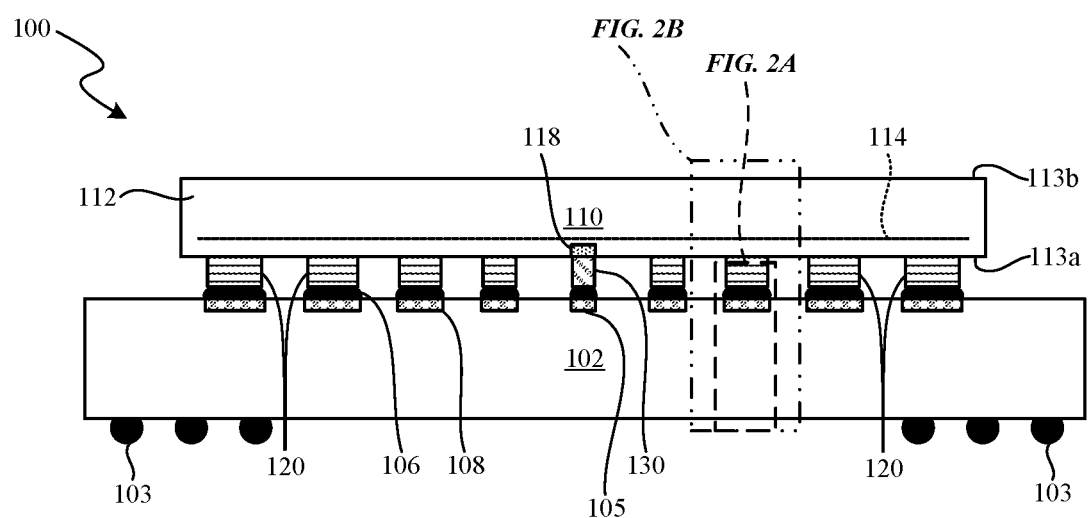
FIG. 1C is a cross-sectional view of the semiconductor package shown in FIG. 1A along line 1C-1C.

FIG. 1C is a cross-sectional view of the package 100 shown in FIG. 1A along line 1C-1C. In the illustrated embodiment, the semiconductor die 110 includes the semiconductor substrate 112 (e.g., a silicon substrate, a gallium arsenide substrate, an organic laminate substrate, etc.) having a first side/surface 113a and a second side/surface 113b opposite the first side 113a. The first side 113a of the semiconductor substrate 112 can be an active side including one or more circuit elements 114 (e.g., wires, traces, interconnects, transistors, etc., shown schematically) and active bond pads 118 formed in and/or on the first side 113a. The circuit elements 114 can include, for example, memory circuits (e.g., dynamic random memory (DRAM) or other type of memory circuits), controller circuits (e.g., DRAM controller circuits), logic circuits, and/or other circuits. In other embodiments, the semiconductor substrate 112 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

The package substrate 102 can include an interposer, a printed circuit board, a dielectric spacer, another semiconductor die (e.g., a logic die), or another suitable substrate with circuitry, such as a redistribution structure. The package substrate 102 can further include active bond pads 105 and electrical connectors 103 (e.g., solder balls, conductive bumps, conductive pillars, conductive epoxies, and/or other suitable electrically conductive elements) electrically coupled to the active bond pads 105. The active bond pads 105 and electrical connectors 103 are configured to electrically couple the package 100 to external devices or circuitry (not shown). The package substrate 102 can also include inactive pads 108 that are not electrically coupled to circuitry.

In the illustrated embodiment, the first side 113a of the semiconductor substrate 112 faces the package substrate 102 (e.g., in a direct chip attach (DCA) configuration). In other embodiments, the semiconductor die 110 can be arranged differently. For example, the second side 113b of the semiconductor substrate 112 can face the package substrate 102 and the semiconductor die 110 can include one or more TSVs extending through the semiconductor substrate 112 to electrically couple the circuit elements 114 to the active pillars 120. Moreover, while only a single semiconductor die 110 is shown in FIG. 1C, in other embodiments the package 100 can include one or more additional semiconductor dies stacked on and/or over the semiconductor die 110.

In the illustrated embodiment, the semiconductor die 110 can be mechanically connected to the package substrate 102 by connecting inactive angled pillars 120 to the inactive bond pads 108 via a bond material 106. The angled pillars 120 can be electrically isolated from the semiconductor die 110 and formed from a material such as copper. The active pillars 130 can be electrically connected to active bond pads 118 of the semiconductor die 110 via the bond material 106. The active pillars 130 can be formed of any suitably conductive material such as, for example, copper, nickel, gold, silicon, tungsten, conductive-epoxy, combinations thereof, etc., and can be formed from using an electroplating, electroless-plating, or other suitable process. In some embodiments, barrier materials (not shown), such as nickel, nickel-based intermetallic, and/or gold, can be formed over end portions of the active pillars 130. The barrier materials can facilitate bonding and/or prevent or at least inhibit the electromigration of copper or other metals used to form the active pillars 130.

In some embodiments, the package 100 can further include an underfill or molded material formed over the package substrate 102 and/or at least partially around the semiconductor die 110. In some embodiments, the package 100 can include other components such as external heatsinks, a casing (e.g., thermally conductive casing), electromagnetic interference (EMI) shielding components, etc.

Figure 2A:
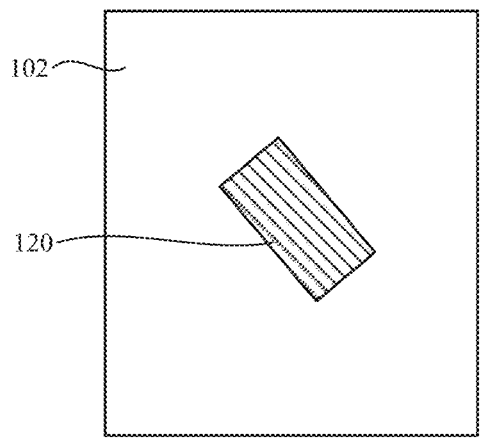
FIGS. 2A and 2B are a cross-sectional view and a perspective view; respectively, of a portion of the semiconductor package shown in FIG. 1C and an angled pillar configured in accordance with embodiments of the present technology.
Figure 2B:
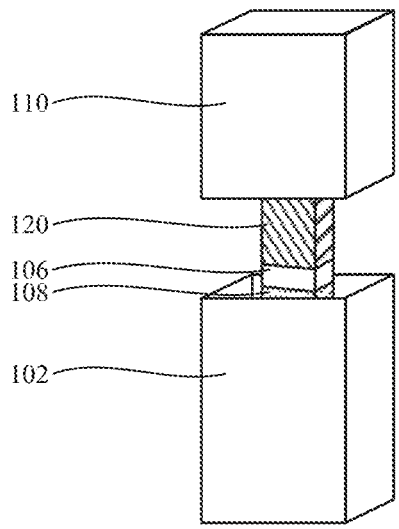

FIGS. 2A and 2B are a cross-sectional view and a perspective view, respectively, of a portion of the semiconductor package 100 shown in FIG. 1C and the angled pillar 120 configured in accordance with embodiments of the present technology. The angled pillar 120 can have a rectangular cross-sectional shape, as opposed to having an oblong, circular, or square cross-sectional shape. FIG. 2B illustrates the angled pillar 120 connected to a passivation material of the semiconductor die 110 and to the inactive pad 108 of the package substrate 102 by the bond material 106. In some embodiments, the angled pillar 120 can be connected to the semiconductor die 110 through a bond material and a bond pad. The active pillar 130 can include features generally similar to the features of the angled pillars 120. As shown in FIGS. 2A and 2B, the angled pillar 120 is orientated at an oblique angle relative to the major and minor reference axes 150 and 152 of the semiconductor die 110.

Figure 3A:
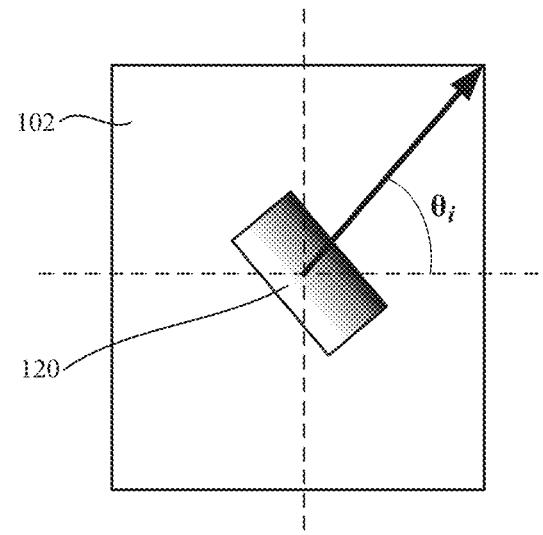
FIG. 3A is a diagram showing directionality of stress with respect to an angled pillar configured in accordance with embodiments of the present technology.
Figure 3B:
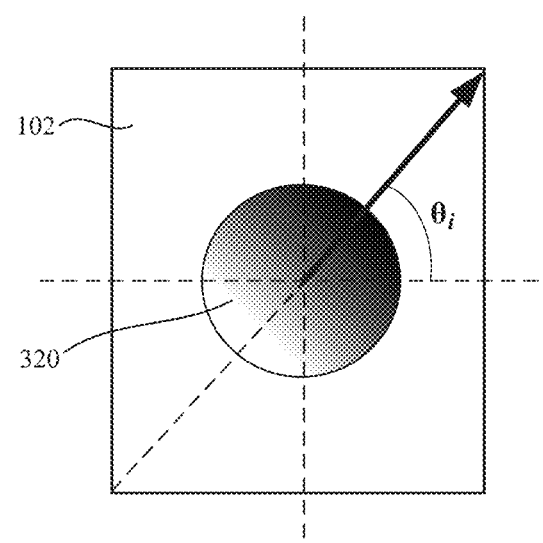
FIG. 3B is a diagram showing directionality of stress with respect to conventional circular pillars.

FIG. 3A is a diagram showing directionality of stress with respect to the angled pillar 120 configured in accordance with embodiments of the present technology, and FIG. 3B is a diagram showing directionality of stress with respect to a conventional circular pillar 320. In FIG. 3A, the angled pillar 120 can be angularly orientated so that the major axis of the angled pillar is at least substantially perpendicular to the direction of local stress to increase a section modulus. Since CTE mismatch and warpage are two primary components responsible for thereto-mechanical stress, crack initiation and crack propagation at the semiconductor die 110 mostly occur in mixed mode fracture (e.g., Mode I: peeling and Mode II: in-plane shearing). Due to thermal loading scenarios during various assembly and test events; the direction of maximum local stress is not horizontal or vertical in the angled pillars 120, but rather it changes based on the location of the angled pillars 120 with respect to the center of the semiconductor die 110. When the angled pillars 120 are angularly orientated in the direction of the stress, the rectangular cross-section can provide a larger section modulus compared to a circular pillar. The increased section modulus can help reduce bending stress and in-plane shear stress at the semiconductor die 100, which is expected to reduce cracking, delamination and other undesirable events. The cross-sectional areas of the angled pillars 120 can be constant or increased depending on pitch to reduce normal stress.

Comparing FIGS. 3A and 3B, the stress contour in the passivation material with the angled pillar 120 (FIG. 3A) at, for example, the outermost corner angled pillar is significantly less than that of the circular pillar 320 (FIG. 3B). More specifically, the size and magnitude of the stress indicated at the upper right region of the angled pillar 120 is less than that of the circular pillar 320. The angled pillars 102 are thus expected to provide an improvement in peeling and in-plane shear stress compared to circular pillars.

Table 1 shows a significant improvement in peeling stress and in-plane shear stress reduction when a rectangular angled pillar is in the outermost corner of the semiconductor package compared to a circular pillar. For example, the maximum peeling stress and maximum in-plane shear stress of a circular shaped pillar is 625 MPa and 191 MPa, respectively. The maximum peeling stress and maximum in-plane shear stress of a square shaped pillar is 15% higher (721 MPa) and 27% lower (139 MPa) than that of the circular shaped pillar, respectively. The maximum peeling stress and maximum in-plane shear stress of the rectangular angled pillar 120 is 24% lower (478 MPa) and 42% lower (110 MPa) than that of the circular shaped pillar, respectively.

| Pillar Shape | Maximum Peeling Stress (MPa) | % Difference from Baseline | Maximum In-plane Shear Stress (MPa) | % Difference from Baseline |
| --- | --- | --- | --- | --- |
| Circular | 625 | Baseline | 191 | Baseline |
| Square | 721 | 15% | 139 | −27% |
| Proposed Rotated Rectangular | 478 | −24% | 110 | −42% |

Figure 4A:
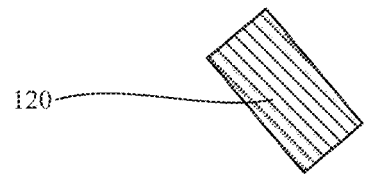
FIGS. 4A-4C are cross-sectional views of angled pillars having various shapes in accordance with embodiments of the present technology.
Figure 4B:
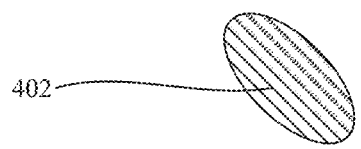
Figure 4C:
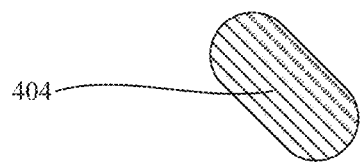

FIGS. 4A-C are cross-sectional views of angled pillars having various shapes in accordance with embodiments of the present technology. FIG. 4A illustrates the angled pillar 120 including a rectangular cross-sectional shape. FIG. 4B illustrates the angled pillar 402 including an oval or elliptical cross-sectional shape. FIG. 4C illustrates the angled pillar 404 including an oblong cross-sectional shape. In these illustrated embodiments, the length of the angled pillars 120, 402, and 404 along the major axis 140 is longer than the width. The shape of the angled pillar can include, but is not limited to, irregular, rectilinear, and trapezoidal.

Figure 5A:
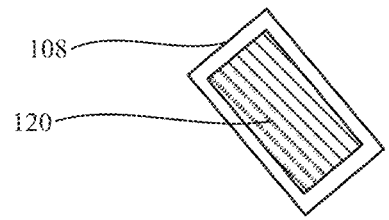
FIGS. 5A-5D illustrate angled pillars and bond pads of the semiconductor package having various shapes in accordance with embodiments of the present technology.
Figure 5B:
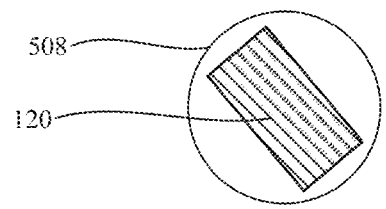
Figure 5C:
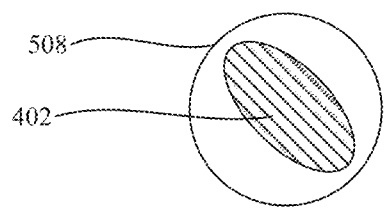
Figure 5D:
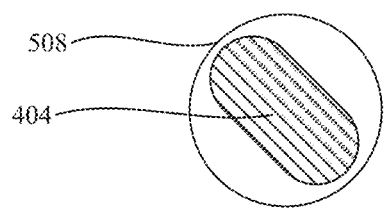

FIGS. 5A-D illustrate angled pillars and bond pads of the semiconductor package 100 having various shapes and configured in accordance with embodiments of the present technology. The various shapes and sizes of the bond pads can be used to cover the whole cross-sectional area of the angled pillars. FIG. 5A illustrates the rectangular bond pad 108 covering the whole cross-section of the rectangular angled pillar 120. FIG. 5B illustrates a circular bond pad 508 covering the whole cross-section of the rectangular angled pillar 120. FIG. 5C illustrates the circular bond pad 508 covering the whole cross-section of the oval or elliptical angled pillar 402. FIG. 5D illustrates the circular bond pad 508 covering the whole cross-section of the oblong angled pillar 404. The active pillars 130 can share features similar to the features of the angled pillars illustrated in FIGS. 5A-D. FIGS. 5A-D show a pillar on pad formation; however, these embodiments can also be used with a pillar on trace application.

Figure 6:
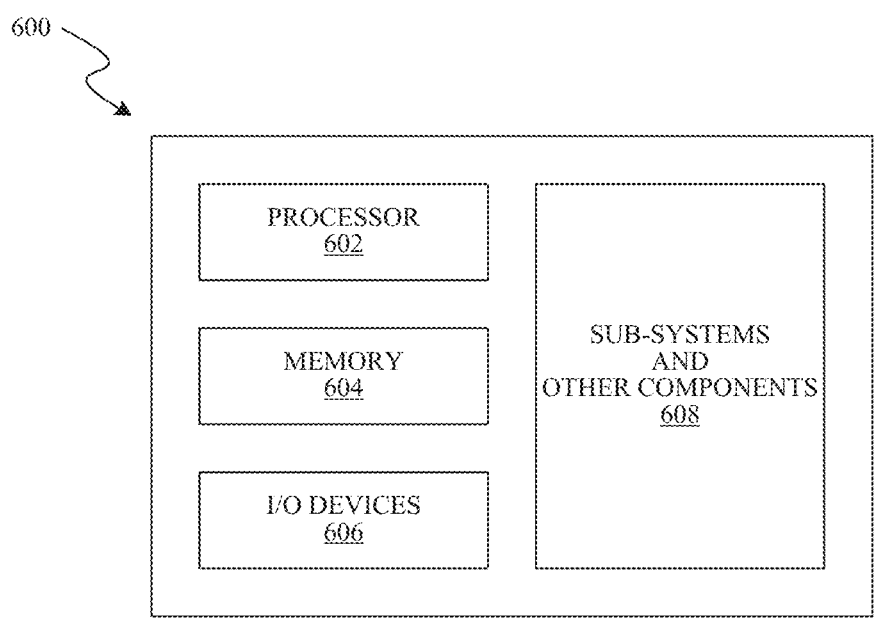
FIG. 6 is a schematic view of a system that includes a semiconductor assembly configured in accordance with embodiments of the present technology.

FIG. 6 is a schematic view of a system that includes a semiconductor assembly configured in accordance with embodiments of the present technology. Any one of the semiconductor devices and/or packages having the features described above with reference to FIGS. 1A-C, 2A-B, 3A, 4A-C, 5A-D can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor dies and/or packages described above with reference to FIGS. 1A-C, 2A-B, 3A, 4A-C, 5A-D can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other example, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:
1. A semiconductor device, comprising:
a package substrate including circuit elements;
a semiconductor die including integrated circuitry, active bond pads electrically coupled to the integrated circuitry, and inactive bond areas electrically isolated from the integrated circuitry, wherein the semiconductor die has an active surface with a major reference axis, a minor reference axis normal to the major reference axis, and a die center coordinate; and angled pillars between the substrate and the semiconductor die, wherein the angled pillars have a non-circular cross-sectional shape with a major pillar axis, a minor pillar axis, and a pillar center coordinate, wherein the major pillar axis is at least approximately normal to a line passing through the die center coordinate and the pillar center coordinate, and wherein the line is at an oblique angle with respect to the major reference axis and the minor reference axis.

2. The semiconductor device of claim 1, wherein approximately normal is 90 degrees plus or minus 2 to 8 degrees, 3 to 7 degrees, 4 to 6 degrees, or 5 degrees.

3. The semiconductor device of claim 1, wherein the non-circular cross-sectional shape is rectangular.

4. The semiconductor device of claim 1, wherein the non-circular cross-sectional shape includes oval, elliptical, square, rectilinear, or irregular.

5. The semiconductor device of claim 1, wherein the at least some of the angled pillars are electrically coupled to an active bond pad of the semiconductor die.

6. The semiconductor device of claim 1, wherein at least some of the angled pillars are connected to an inactive bond area of the semiconductor die.

7. The semiconductor device of claim 1, further comprising aligned pillars that have a major pillar axis that is at least substantially parallel to one of the major reference axis or the minor reference axis, and wherein the aligned pillars are electrically coupled to active bond pads of the semiconductor die.

8. The semiconductor device of claim 1, further comprising aligned pillars that have a major pillar axis that is at least substantially parallel to one of the major reference axis or the minor reference axis, and wherein the aligned pillars are electrically coupled to active bond pads of the semiconductor die and the angled pillars are coupled to inactive bond areas of the semiconductor die.

9. The semiconductor device of claim 1, further comprising aligned pillars that have a major pillar axis that is at least substantially parallel to the major reference axis or the minor reference axis, and wherein the aligned pillars are electrically coupled to active bond pads of the semiconductor die, a first set of the angled pillars are electrically coupled to active bond pads of the semiconductor die, and a second set of the angled pillars are coupled to inactive bond areas of the semiconductor die.

10. A method of forming a semiconductor device, the method comprising:

forming angled pillars on a semiconductor die, the semiconductor die including integrated circuitry, active bond pads electrically coupled to the integrated circuitry, and inactive bond areas electrically isolated from the integrated circuitry, wherein the semiconductor die also has an active surface with a major reference axis, a minor reference axis normal to the major reference axis, and a die center coordinate, and the angled pillars have a non-circular cross-sectional shape with a major pillar axis, a minor pillar axis, and a pillar center coordinate, and wherein the major pillar axis is at least approximately normal to a line passing through the die center coordinate and the pillar center coordinate at an oblique angle with respect to the major reference axis and the minor reference axis; and attaching the angled pillars to a package substrate.

11. The method of claim 10, wherein approximately normal is 90 degrees plus or minus 2 to 8 degrees, 3 to 7 degrees, 4 to 6 degrees, or 5 degrees.

12. The method of claim 10, wherein the non-circular cross-sectional shape is rectangular.

13. The method of claim 10, wherein the non-circular cross-sectional shape includes oval, elliptical, square, rectilinear, or irregular.

14. The method of claim 10, wherein at least some of the pillars are electrically coupled to an active bond pad of the semiconductor die.

15. The method of claim 10, wherein at least some of the pillars are connected to an inactive bond area of the semiconductor die.

16. The method of claim 10, further comprising aligned pillars that have a major pillar axis that is at least substantially parallel to one of the major reference axis or the minor reference axis, and wherein the aligned pillars are electrically coupled to active bond pads of the semiconductor die.

17. The method of claim 16, further comprising aligned pillars that have a major pillar axis that is at least substantially parallel to one of the major reference axis or the minor reference axis, and wherein the aligned pillars are electrically coupled to active bond pads of the semiconductor die and the angled pillars are coupled to inactive bond areas of the semiconductor die.

18. The method of claim 16, further comprising aligned pillars that have a major pillar axis that is at least substantially parallel to the major reference axis or the minor reference axis, and wherein the aligned pillars are electrically coupled to active bond pads of the semiconductor die, a first set of the angled pillars are electrically coupled to active bond pads of the semiconductor die, and a second set of the angled pillars are coupled to inactive bond areas of the semiconductor die.

19. A semiconductor device, comprising:

a package substrate including circuit elements;

a semiconductor die including integrated circuitry, active bond pads electrically coupled to the integrated circuitry, and inactive bond areas electrically isolated from the integrated circuitry, wherein the semiconductor die also has a lengthwise dimension and a widthwise dimension; and angled pillars between the substrate and the semiconductor die, wherein the angled pillars have a non-circular cross-sectional shape with a first dimension, a second dimension normal to the first dimension and less than the first dimension, and a pillar center coordinate, wherein the second dimension extends along an axis at a non-zero angle with respect to both the lengthwise dimension and the widthwise dimension.

20. The semiconductor device of claim 19, further comprising aligned pillars that have a major pillar axis that is at least substantially parallel to the lengthwise dimension or the widthwise dimension, and wherein the aligned pillars are electrically coupled to active bond pads of the semiconductor die, a first set of the angled pillars are electrically coupled to active bond pads of the semiconductor die, and a second set of the angled pillars are coupled to inactive bond areas of the semiconductor die.

* * * * *